US008686409B2

(12) United States Patent
Lee et al.

(10) Patent No.: US 8,686,409 B2
(45) Date of Patent: Apr. 1, 2014

(54) METHOD OF REPAIRING SHORT CIRCUIT DEFECT, AND DISPLAY APPARATUS AND ORGANIC LIGHT EMITTING DISPLAY APPARATUS MANUFACTURED ACCORDING TO THE REPAIRING METHOD

(71) Applicants: Yul-Kyu Lee, Yongin (KR); Sun Park, Yongin (KR); Kyu-Sik Cho, Yongin (KR)

(72) Inventors: Yul-Kyu Lee, Yongin (KR); Sun Park, Yongin (KR); Kyu-Sik Cho, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/665,008

(22) Filed: Oct. 31, 2012

(65) Prior Publication Data

US 2013/0328020 A1    Dec. 12, 2013

(30) Foreign Application Priority Data

Jun. 8, 2012    (KR) .................. 10-2012-0061673

(51) Int. Cl.
 *H01L 35/24* (2006.01)
(52) U.S. Cl.
 USPC ................ 257/40; 257/E51.001; 438/99

(58) Field of Classification Search
 USPC ................ 257/40, E51.001; 438/99
 See application file for complete search history.

(56) References Cited

U.S. PATENT DOCUMENTS

| 7,163,833 B2 | 1/2007 | Jinno |
| 2009/0262049 A1 | 10/2009 | Yoon et al. |
| 2012/0175649 A1 | 7/2012 | Hong |

FOREIGN PATENT DOCUMENTS

| JP | 2004-342457 | 12/2004 |
| KR | 10-2005-0076913 A | 7/2005 |
| KR | 10-2009-0109928 | 10/2009 |
| KR | 10-2012-0081810 | 7/2012 |

*Primary Examiner* — Anthony Ho
(74) *Attorney, Agent, or Firm* — Lee & Morse, P.C.

(57) ABSTRACT

A method of repairing a defective pixel in a display apparatus that includes forming an insulating layer to cover the plurality of second signal wires, cutting both sides of a region of the corresponding second signal wire of the defective pixel and the insulating layer to form both sides of a cut region, forming contact holes adjacent to the both sides of the cut region, respectively, such that an upper portion of the corresponding second signal wire is exposed, forming a repair metal layer on the insulating layer to contact the contact holes and the second signal wire, and forming a repair insulating layer to cover the repair metal layer.

20 Claims, 10 Drawing Sheets

METHOD OF REPAIRING SHORT CIRCUIT DEFECT, AND DISPLAY APPARATUS AND ORGANIC LIGHT EMITTING DISPLAY APPARATUS MANUFACTURED ACCORDING TO THE REPAIRING METHOD

CROSS-REFERENCE TO RELATED PATENT APPLICATION

This application claims priority under 35 U.S.C. §119 to Korean Patent Application No. 10-2012-0061673, filed on Jun. 8, 2012, in the Korean Intellectual Property Office, the disclosure of which is incorporated herein in its entirety by reference.

BACKGROUND

Recently, display apparatuses are being manufactured as portable thin film flat panel display apparatuses. An organic light emitting display apparatus is a self-emitting display apparatus and has a larger viewing angle, improved contrast characteristics, and a faster response speed, compared to some other flat panel display apparatuses. Thus, the organic light emitting display apparatus has drawn attention as a next-generation display apparatus.

An organic light-emitting display apparatus includes a thin film transistor (TFT), an organic electroluminescent (EL) device that is driven by the TFT to form an image, and the like. When current is supplied to the organic EL device via the TFT, light is emitted from the organic EL device, thereby forming an image.

SUMMARY

Embodiments may be realized by providing a method of repairing a defective pixel, caused by a short circuit defect occurring in a first signal wire and a second signal wire included in a display apparatus including pixels each being defined by one of a plurality of first signal wires and one of a plurality of second signal wires intersecting the first signal wires, the method including forming an insulating layer to cover the second signal wires; cutting both sides of a region of the second signal wire in which the short circuit defect occurs, and the insulating layer; forming contact holes at the both sides of the cut region, respectively, so as to expose an upper surface of the second signal wire; forming a repair metal layer on the insulating layer to contact the contact holes and the second signal wire; and forming a repair insulating layer to cover the repair metal layer.

The forming of the insulating layer may include a last photolithographical process performed during manufacture of the display apparatus. The forming of the insulating layer may include forming a pixel defining layer of the display apparatus. The cutting of the both sides of the region and the insulating layer may use laser.

The repair insulating layer and the insulating layer covering the second signal wire may be each formed of an organic insulating layer. The repair insulating layer may be formed on a part of the display apparatus. The repair metal layer may be formed of a material used to form the second signal wire. The repair metal layer may be formed not to overlap with a line on which the second signal wire is formed.

Embodiments may also be realized by providing a display apparatus in which a defective pixel, caused by a short circuit defect occurring in a first signal wire and a second signal wire is repaired from among pixels each being defined by one of a plurality of first signal wires and one of a plurality of second signal wires intersecting the first signal wires, the repaired pixel including an insulating layer including cut lines formed at both sides of a region of the second signal wire in which the short circuit defect occurs, and contact holes disposed apart from the cut lines to expose an upper surface of the second signal wire; a repair metal layer formed on the insulating layer and connected to the second signal wire via the contact holes; and a repair insulating layer covering the cut lines and the repair metal layer.

Each of the plurality of first signal wires and the plurality of second signal wires may be one of scan lines and data lines. The cut lines may be formed along the both sides of the region of the second signal wire in which the short circuit defect occurs, to extend in the insulating layer. The repair metal layer may be formed to route a line on which the second signal wire is formed.

The repair insulating layer may be formed only on the defective pixel. The insulating layer and the repair insulating layer may be organic insulating layers.

Embodiments may also be realized by providing an organic light emitting display apparatus in which a defective pixel, caused by a short circuit defect occurring in a first signal wire and a second signal wire is repaired from among pixels each being defined by one of a plurality of first signal wires and one of a plurality of second signal wires intersecting the first signal wires, each of the pixels including a first electrode, a second electrode, and an organic emission layer between the first and second electrodes, the repaired pixel including an insulating layer including cut lines formed at both sides of a region of the second signal wire in which the short circuit defect occurs, and contact holes disposed apart from the cut lines to expose an upper surface of the second signal wire; a repair metal layer formed on the insulating layer to route a line on which the second signal wire is formed, and connected to the second signal wire via the contact holes; and a repair insulating layer covering the cut lines and the repair metal layer.

Each of the plurality of first signal wires and the plurality of second signal wires may be one of scan lines and data lines. Each of the pixels may include at least one thin film transistor (TFT), and the scan lines and the data lines may be formed on a layer on which a gate electrode and source and drain electrodes of the at least one TFT are disposed.

The gate electrode and the first electrode may be formed on the same layer. The insulating layer may be a pixel defining layer that defines formed a light emitting device formed on the first electrode. The repair insulating layer may be formed only on the defective pixel.

BRIEF DESCRIPTION OF THE DRAWINGS

Features will become more apparent by describing in detail exemplary embodiments thereof with reference to the attached drawings in which.

DETAILED DESCRIPTION

Figure 1:
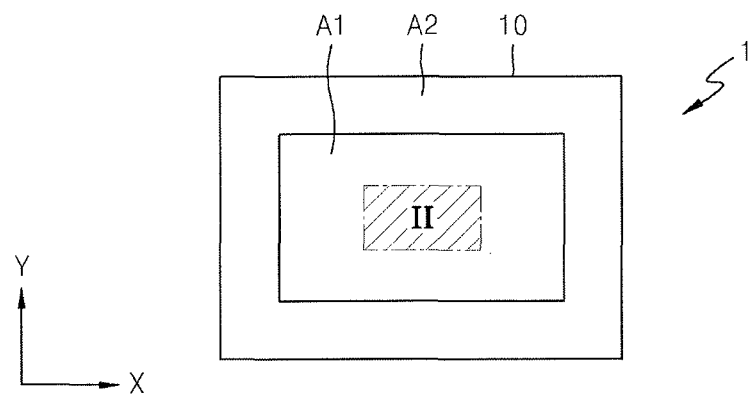
FIG. 1 is a schematic plan view of an organic light emitting display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the term "and/or" includes any and all combinations of one or more of the associated listed items, and the expression "at least one of," when preceding a list of elements, modify the entire list of elements and do not modify the individual elements of the list. In the figures, the dimensions of layers and regions may be exaggerated for clarity of illustration. Like reference numerals refer to like elements throughout.

Figure 2:
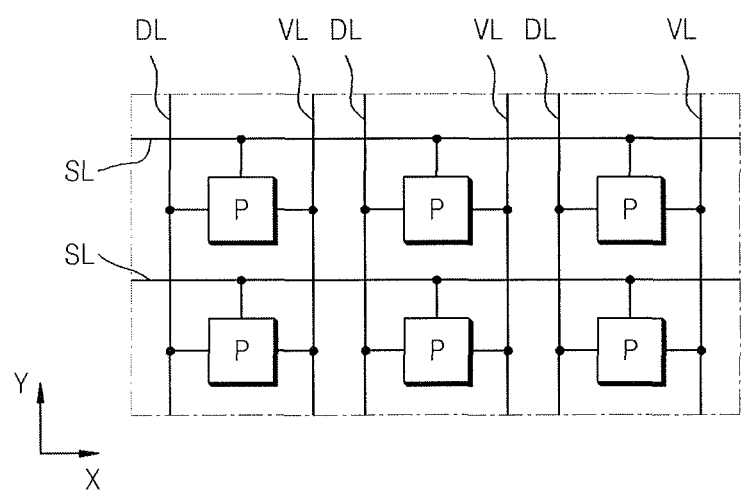
FIG. 2 is a diagram schematically illustrating a structure of wires included in a region II of FIG. 1, according to an exemplary embodiment.

FIG. 1 is a schematic plan view of an organic light emitting display apparatus 1 according to an exemplary embodiment. FIG. 2 is a diagram schematically illustrating a structure of wires included in a region II of FIG. 1, according to an exemplary embodiment.

Referring to FIGS. 1 and 2, in the organic light emitting display apparatus 1 according to the current embodiment, a display region A1 and a non-display region A2 are formed on a substrate 10.

The display region A1 displays an image therein and may be disposed in a region of the substrate 10 including a center of the substrate 10. The non-display region A2 may be disposed on the substrate 10 to surround the display region A1.

A plurality of pixels P forming an image may be included in the display region A1.

The plurality of pixels P may be defined as scan lines SL extending in a first direction (X-axis direction) and data lines DL extending in a second direction (Y-axis direction) perpendicular to the first direction (X-axis direction). A data signal provided from a data driver (not shown) included in the non-display region A2 is supplied to the plurality of pixels P via the data lines DL, and a scan signal provided from a scan driver (not shown) included in the non-display region A2 is supplied to the plurality of pixels P via the scan lines SL. Although FIG. 2 illustrates that the data lines DL extend in the second direction (Y-axis direction) and the scan lines SL extend in the first direction (X-axis direction), embodiments not limited thereto. In other words, the directions in which the data lines DL and the scan lines SL respectively extend may be switched to each other.

The plurality of pixels P are connected to power supply lines VL extending in the second direction (Y-axis direction). A first power supply voltage supplied from a power source driver (not shown) included in the non-display region A2 is applied to the plurality of pixels P via the power supply lines VL. Each of the plurality of pixels P controls the amount of current to be supplied to a second power supply voltage ELVSS(t) of FIG. 3 from a power source (not shown) via an organic electroluminescent (EL) device OLED of FIG. 3, according to a data signal.

In such a wire structure, a short circuit defect may occur to produce a defective pixel when electricity is conducted through the scan lines SL and the data lines DL or through the scan lines SL and the power supply voltage lines VL, e.g., due to undesired particles, during the manufacture of the organic light emitting display apparatus 1.

Figure 3:
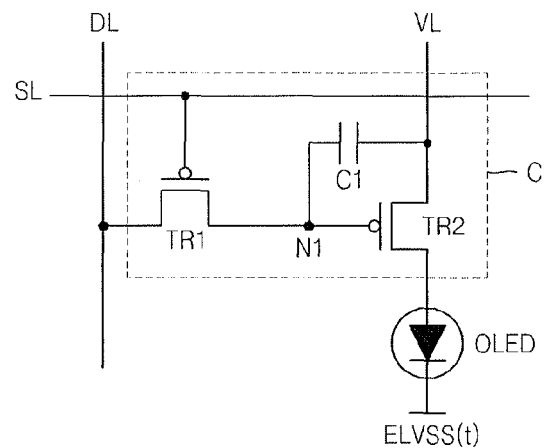
FIG. 3 is a circuit diagram of one of pixels illustrated in FIG. 2, according to an exemplary embodiment.

FIG. 3 is a circuit diagram of one of the pixels P illustrated in FIG. 2, according to an exemplary embodiment.

Referring to FIG. 3, the pixel P includes the organic EL device OLED, and a pixel circuit C for supplying current to the organic EL device OLED.

In the organic EL device OLED, a pixel electrode is connected to the pixel circuit C and an opposite electrode is connected to the second power supply voltage source ELVSS (t). The organic EL device OLED generates light having a brightness corresponding to current supplied from the pixel circuit C.

An active matrix organic light emitting display apparatus includes at least two transistors and at least one capacitor. For example, the active matrix organic light emitting display apparatus includes a switching transistor for delivering a data signal, a driving transistor for driving an organic light emitting diode according to the data signal, and a capacitor for maintaining a data voltage constant.

Referring to FIGS. 2 and 3, in a first transistor TR1, a gate electrode is connected to a scan line SL, a first electrode is connected to a data line DL, and a second electrode is connected to a first node N1. That is, a scan signal is supplied to the gate electrode of the first transistor TR1 and a data signal is supplied to the first electrode of the first transistor TR1.

In a second transistor TR2, a gate electrode is connected to the first node N1, a first electrode is connected to a first power supply voltage source ELVDD(t)(not shown) via the power supply lines VL, and a second electrode is connected to the pixel electrode of the organic EL device OLED. The second transistor TR2 may act as a driving transistor. A first capacitor C1 may be connected between the first node N1 and the first electrode of the second transistor TR2.

Figure 4:
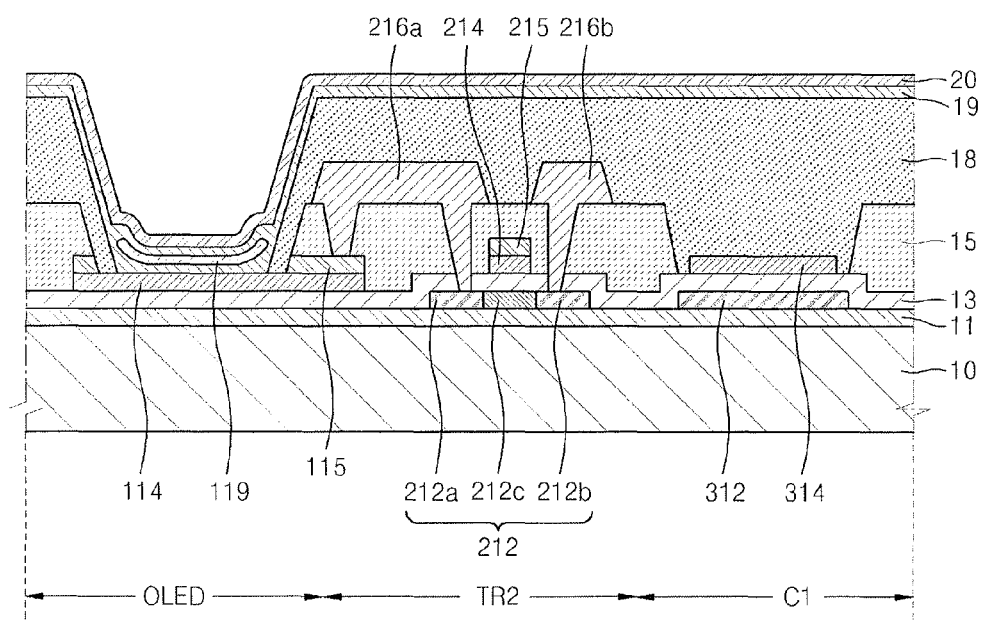
FIG. 4 is a cross-sectional view of some elements of each of pixels illustrated in FIG. 2, according to an exemplary embodiment.

FIG. 4 is a cross-sectional view of some elements of each of pixels illustrated in FIG. 2, according to an exemplary embodiment. Referring to FIG. 4, the second transistor TR2, which is a thin film driving transistor, a capacitor C1, and an organic EL device are disposed on a substrate 10.

The substrate 10 may be formed of a $SiO_2$-based transparent glass material. However, embodiments are not limited thereto, e.g., the substrate 10 may be formed of a transparent plastic material.

A buffer layer 11 may further be disposed on the substrate 10. The buffer layer 11 may provide a flat surface on the substrate 10 and protect the substrate 10 against moisture and foreign substances.

An active layer 212 of the second transistor TR2 is formed on the buffer layer 11. The active layer 212 includes a source region 212b, a drain region 212a, and a channel region 212c. The active layer 212 may include polycrystalline silicon, and N+ or P+ type ion impurities may be doped onto the source region 212b and drain region 212a.

A first insulating layer 13 that includes a silicon oxide $SiO_2$ and/or a silicon nitride $SiN_x$ and acts as a gate insulating layer is formed on the active layer 212. A first-layer gate electrode 214 and a second-layer gate electrode 215 are disposed on a location of the first insulating layer 13 to correspond to the channel region 212c of the active layer 212. The first-layer gate electrode 214 may include at least one transparent conductive oxide selected from an indium tin oxide (ITO), an indium zinc oxide (IZO), a zinc oxide (ZnO), an indium oxide ($In_2O_3$), an indium gallium oxide (IGO), and an aluminum zinc oxide (AZO).

The second-layer gate electrode 215 may be a single or multi-layered structure including at least one low-resistive metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). According to an exemplary embodiment, the scan lines SL of FIG. 2 may be formed on a layer on which the first-layer gate electrode 214 and the second-layer gate electrode 215 are disposed, by using the same material.

A source electrode 216b and a drain electrode 216a are formed on the gate electrode 215 through second insulating layers 15, which are interlayer insulating layers, to be respectively connected to the source region 212b and the drain region 212a of the active layer 212. The second insulating layer 15 may include a silicon oxide $SiO_2$ and/or a silicon nitride $SiN_x$.

The source electrode 216b and the drain electrode 216a may each be a single or multi-layered structure including at least one low-resistive metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). According to an exemplary embodiment, the data lines DL (see FIG. 2) may be formed on a same layer on which the source electrode 261b and the drain electrode 216a are disposed.

In the organic light emitting display apparatus 1, e.g., which has a wire structure as discussed above, a short circuit defect may occur to produce defective pixels when electricity is conducted through the scan lines SL and the data lines DL. For example, the short circuit defect may occur due to undesired particles during the manufacture of the organic light emitting display apparatus 1.

A third insulating layer 18, which is a pixel define layer, is formed on the second insulating layers 15 to expose portions of a first-layer pixel electrode 114 and/or a second-layer pixel electrode 115 while covering the source electrode 216b and the drain electrode 216a, thereby defining an emission region. For example, the third insulating layer 18 may expose an upper portion of the first-layer pixel electrode 114 and sides of the second-layer pixel electrode 115. The third insulating layer 18 may include an organic insulating layer.

One of the source electrode 216b and the drain electrode 216a is connected to the first-layer pixel electrode 114 and the second-layer pixel electrode 115 formed on a same layer on which the first-layer gate electrode 214 and the second-layer gate electrode 215 are disposed. The first-layer pixel electrode 114 may include the transparent conductive oxide that the first-layer gate electrode 214 includes. The second-layer pixel electrode 115 formed on upper edges the first-layer pixel electrode 114 may include the at least one low-resistive metal used to form the second-layer gate electrode 215.

Although FIG. 4 illustrates that some portions of the second-layer pixel electrode 115 are disposed on the upper edges of the first-layer pixel electrode 114 in such a manner that the second insulating layer 15 may cover some portions of the second-layer pixel electrode 115, embodiments are not limited thereto. For example, the second-layer pixel electrode 115 may not be present on the first-layer pixel electrode 114, except that the second-layer pixel electrode 115 partially contacts one of the source electrode 216b and the drain electrode 216a.

An intermediate layer 19 including an organic emission layer 119 is formed on the first-layer pixel electrode 114. An opposite electrode 20 is formed as a common electrode on the intermediate layer 19.

In the case of the organic light emitting display apparatus 1 according to the current embodiment, the first-layer pixel electrode 114 and the second-layer pixel electrode 115 act as anodes and the opposite electrode 20 acts as a cathode, or vice versa. Although not shown in FIG. 4, a sealing member may be disposed on the opposite electrode 20.

In a region of the capacitor C1, a lower electrode 312 of the capacitor C1 is formed on a same layer on which the active layer 212 is disposed, and a first-layer upper electrode 314 of the capacitor C1 is formed on a same layer on which the first-layer pixel electrode 114 and the first-layer gate electrode 214 are disposed.

In the lower electrode 312 of the capacitor C1, N+ or P+ type ion impurities may be doped, similar to the source region 212b and the drain region 212a of the active layer 212. The first-layer upper electrode 314 of the capacitor C1 may include a transparent conductive oxide.

A mask process may be simplified by forming the lower electrode 312 of the capacitor C1 and the active layer 212 on the same layer, forming the first-layer upper electrode 314 of the capacitor C1, the first-layer gate electrode 214, and first-layer pixel electrode 114 on the same layer, and forming the second-layer pixel electrode 115 and the second-layer gate electrode 215 on the same layer. The mask process may further be simplified by etching the second-layer pixel electrode 115 and a low-resistive metal layer (not shown) formed on the first-layer upper electrode 314 of the capacitor C1 together when the source electrode 216b and the drain electrode 216a are patterned.

Figure 5A:
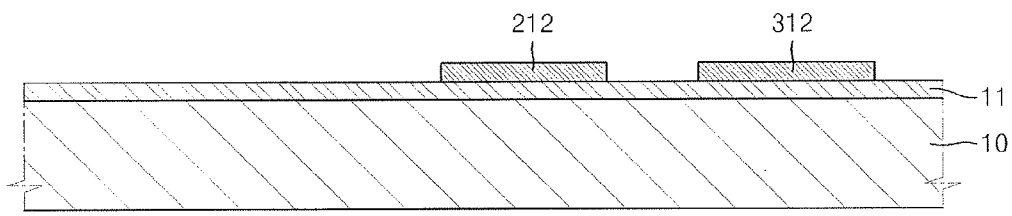
FIGS. 5A to 5E are schematic cross-sectional views depicting stages in a method of manufacturing the pixel of FIG. 4, according to an exemplary embodiment.

FIGS. 5A to 5E are schematic cross-sectional views depicting stages in a method of manufacturing the pixel of FIG. 4, according to an exemplary embodiment. Referring to FIG. 5A, a buffer layer 11 is formed on a substrate 10, and a semiconductor layer (not shown) is formed on the buffer layer 11 and then is patterned to form an active layer 212 and a lower electrode 312 of the capacitor C1. The semiconductor layer may be patterned by general photolithography. For example, a photoresist (not shown) is formed on the semiconductor layer, and the active layer 212 and the lower electrode 312 of the capacitor C1 are formed according to exposure, development, etching, and strip processes by using a photo mask (not shown).

Figure 5B:
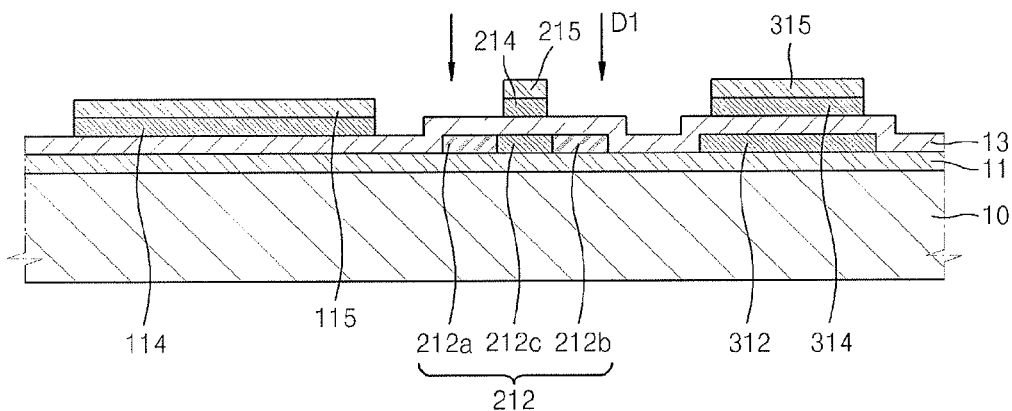

Referring to FIG. 5B, a first insulating layer 13, a layer (not shown) including a transparent conductive oxide, and a layer (not shown) including low-resistive metal are formed on the resultant structure of FIG. 5A. Further, the layer including the transparent conductive oxide and layer including the low-resistive metal are patterned to form a first-layer pixel electrode 114, a second-layer pixel electrode 115, a first-layer gate electrode 214, a second-layer gate electrode 215, and the first-layer upper electrode 314 and a second-layer upper electrode 315 of the capacitor C1. Then, ion impurities are primarily doped onto a source region 212b and a drain region 212a (first doping D1). The scan lines SL described above may be formed according to a photo mask process used to form the first-layer gate electrode 214 and the second-layer gate electrode 215.

Figure 5C:
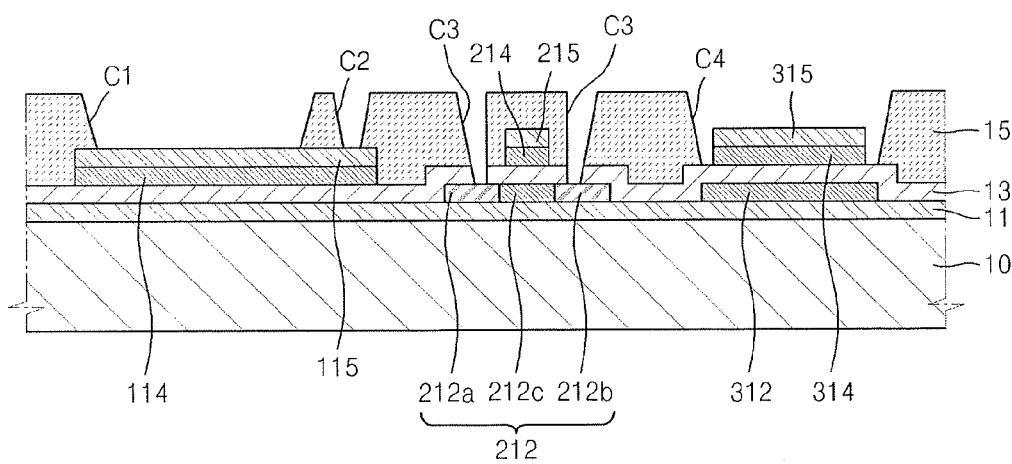

Referring to FIG. 5C, a second insulating layer 15 is formed on the resultant structure of FIG. 5B and is then patterned by photolithography so as to form an aperture C1 for exposing the first-layer pixel electrode 114 and the second-layer pixel electrode 115, an aperture C2 for connecting the first-layer pixel electrode 114 and the second-layer pixel electrode 115 to the source electrode 216b or the drain electrode 216a, apertures C3 for exposing the source region 212b and the drain region 212a, and an aperture C4 for exposing the first-layer upper electrode 314 and the second-layer upper electrode 315 of the capacitor C1.

Figure 5D:
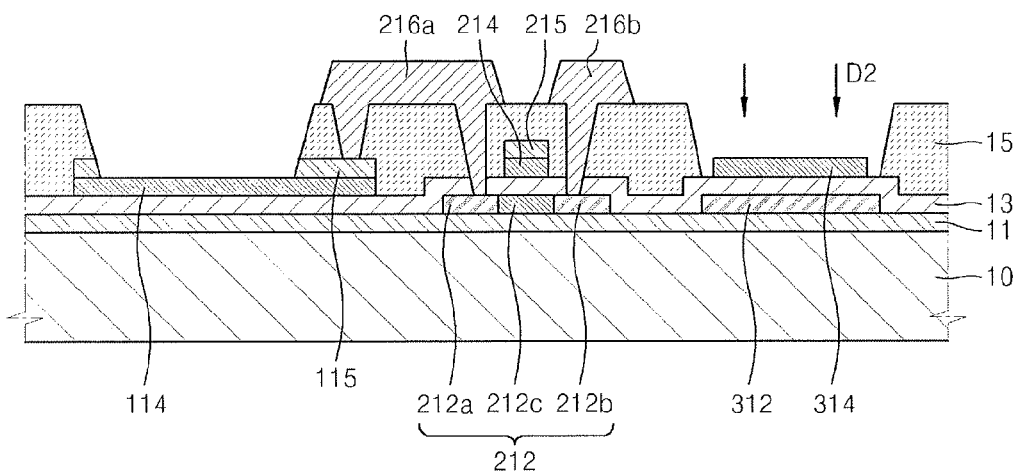

Referring to FIG. 5D, a low-resistive metal layer (not shown) is formed on the resultant structure of FIG. 5C and is then patterned by photolithography to form a source electrode 216b and a drain electrode 216a. According to an exemplary embodiment, the second-layer pixel electrode 115 and the second-layer upper electrode 315 of the capacitor C1 are etched when the source electrode 216b and the drain electrode 216a are etched, and ion impurities are secondarily doped on the resultant structure (second doping D2). When the second doping D2 is performed, the ion impurities are doped onto the lower electrode 312 (lower electrode) of the capacitor C1, thereby increasing the electrostatic capacitance of the capacitor C1. The data lines DL described above may be formed according to a photo mask process used to form the source electrode 216b and the drain electrode 216a.

Figure 5E:
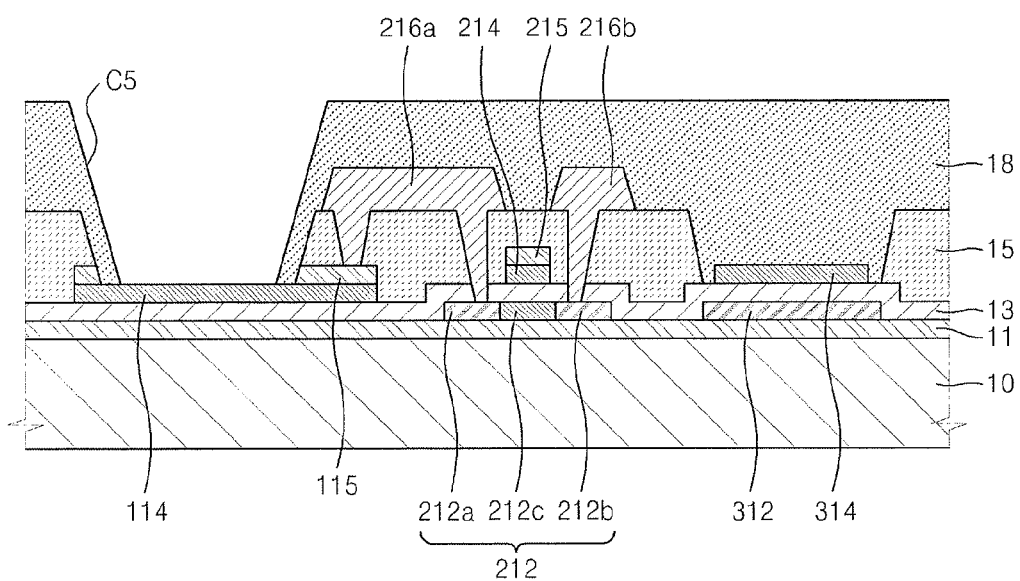

Referring to FIG. 5E, a third insulating layer 18 is formed on the resultant structure of FIG. 5D and is then patterned to form an aperture C5 for exposing an upper portion of the first-layer pixel electrode 114.

Then, a process of forming a backside of an organic light emitting display apparatus is completed. This process is performed by general photolithography as described above. When the backside is obtained by photolithography, subsequent processes of forming an intermediate layer including an organic emission layer and an opposite electrode are performed, as described above.

If a short circuit defect occurs between the scan lines SL and the data lines DL or between the scan lines SL and the power supply lines VL, e.g., due to undesired particles during the manufacture of organic light emitting display apparatus 1 of FIG. 1, then a repair process may be performed. The repair process may include cutting both ends, e.g., opposing sides, of an upper wire adjacent to where the short circuit defect occurs. For example, the repair process may include cutting opposing sides of the data lines DL or the power supply lines VL, which are upper wires, where the short circuit defect occurs by using cutting means, e.g., laser. According to an exemplary embodiment, the repair process may be performed while the third insulating layer 18 is formed or after the third insulating layer 18 is formed.

A process of repairing the organic light emitting display apparatus 1 of FIG. 1 according to an exemplary embodiment will be described with reference to FIGS. 6A to 10B.

FIGS. 6A, 7A, 8A, 9A, and 10A are plan views of a process of repairing a short circuit defect occurring at an intersection of a scan line and a data line, according to an exemplary embodiment. FIGS. 6B, 7B, 8B, 9B, and 10B are schematic cross-sectional views, taken along lines A-B of FIGS. 6A, 7A, 8A, 9A, and 10A, respectively.

Figure 6A:
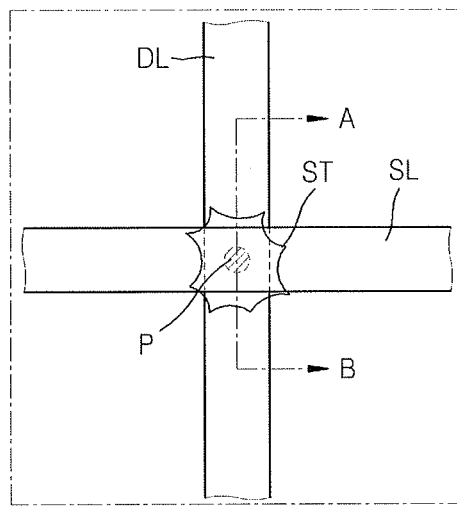
FIGS. 6A, 7A, 8A, 9A, and 10A are plan views of a process of repairing a short circuit defect occurring at an intersection of a scan line and a data line, according to an exemplary embodiment.
Figure 6B:
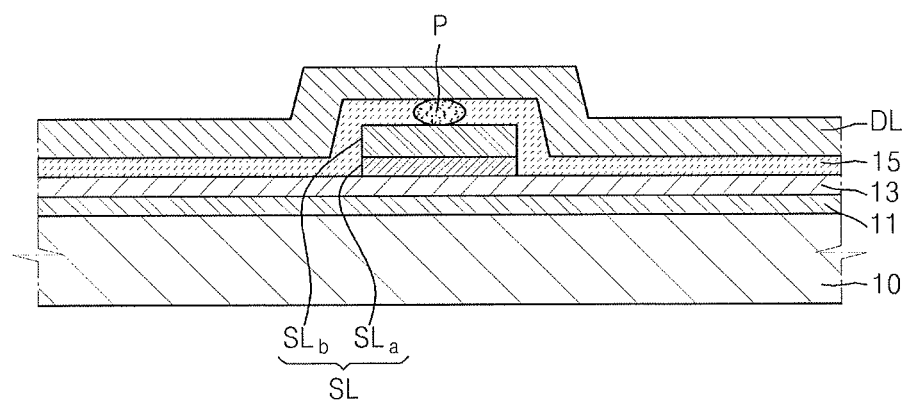
FIGS. 6B, 7B, 8B, 9B, and 10B are schematic cross-sectional views, taken along lines A-B of FIGS. 6A, 7A, 8A, 9A, and 10A, respectively.

Referring to FIGS. 6A and 6B, scan lines SL, which include a scan line $Sl_a$ and a scan line $SL_b$, may be formed to extend from the first-layer gate electrode 214 and the second-layer gate electrode 215 (see FIG. 4) and may be formed on the buffer layer 11 and the first insulating layer 13. Then, the second insulating layer 15 is formed to cover the scan lines SL, and a data line DL extending from the source electrode 216b and the drain electrode 216a (see FIG. 4) is formed on the second insulating layer 15 to intersect the scan lines SL. FIGS. 6A and 6B illustrate a case a short-circuit defect region ST occurs since the scan lines SL and the data line DL are short-circuited in a region where the scan lines SL and the data line DL intersect one another, due to undesired particles P.

Figure 7A:
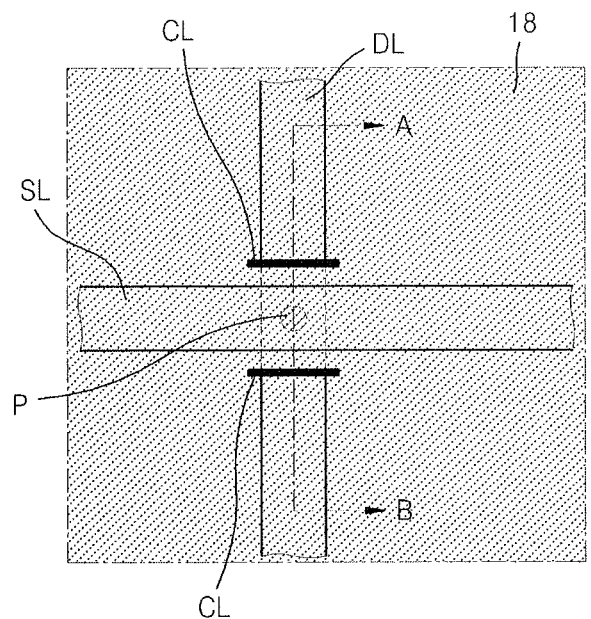
Figure 7B:
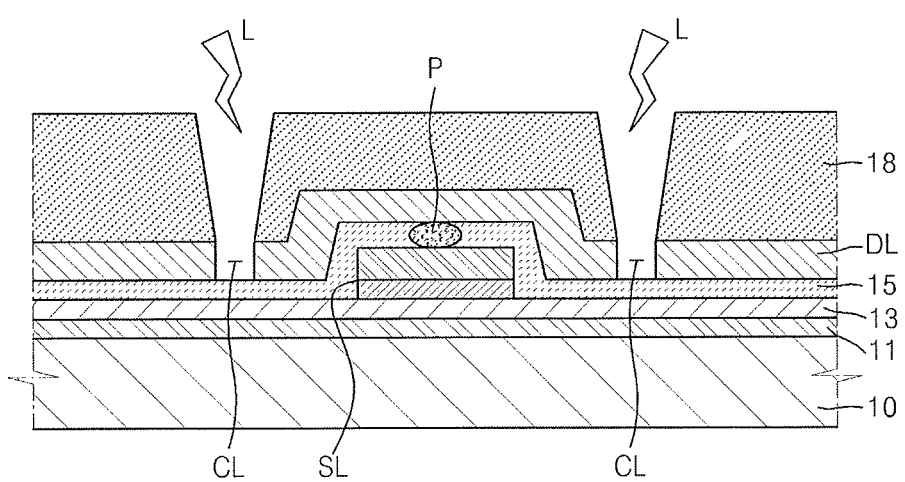

Referring to FIGS. 7A and 7B, the third insulating layer 18 is formed to cover a TFT and the short-circuit defect region ST, and both ends of the data line DL connected to, e.g., overlapping, the short-circuit defect region ST are cut using cutting means such as a laser L. In this case, the third insulating layer 18 disposed on the data line D is cut together with the data line D, due to energy emitted from the laser L. Thus, cut lines CL are respectively formed at the both sides of the short-circuit defect region ST, in both the data line D and the third insulating layer 18.

Figure 8A:
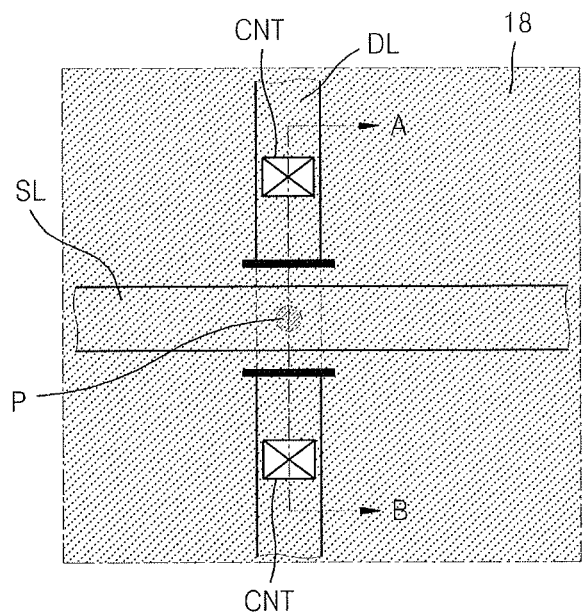
Figure 8B:
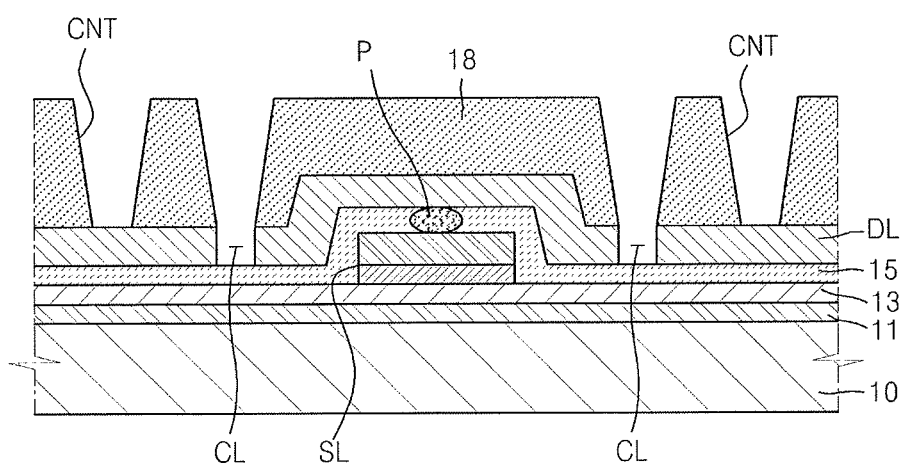

Referring to FIGS. 8A and 8B, after the cut lines CL are formed, the third insulating layer 18 is patterned to form two contact holes CNT that expose an upper surface of the data line DL. The two contact holes CNT are respectively disposed apart from outer sides of the cut lines CL, which are formed at the both sides of the short-circuit defect region ST, by a predetermined distance.

Figure 9A:
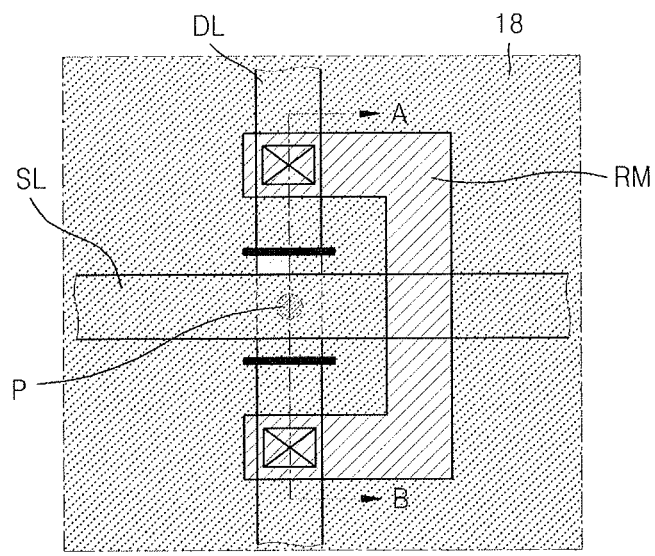
Figure 9B:
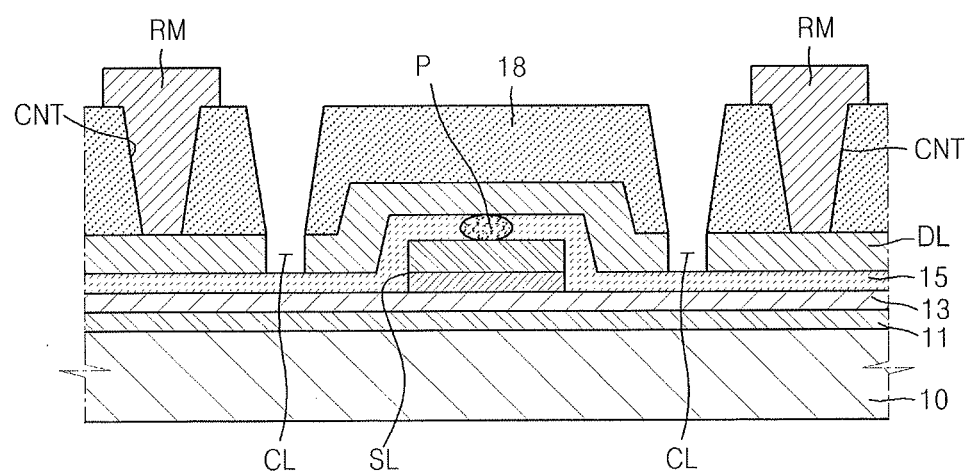

Referring to FIGS. 9A and 9B, a repair metal layer RM is formed on the third insulating layer 18. The repair metal layer RM is connected to the data line via the two contact holes CNT but is not formed in the cut lines CL. That is, the repair metal layer RM is formed as a by-pass route wire not to overlap with the short-circuit defect region ST of the existing data line DL.

Figure 10A:
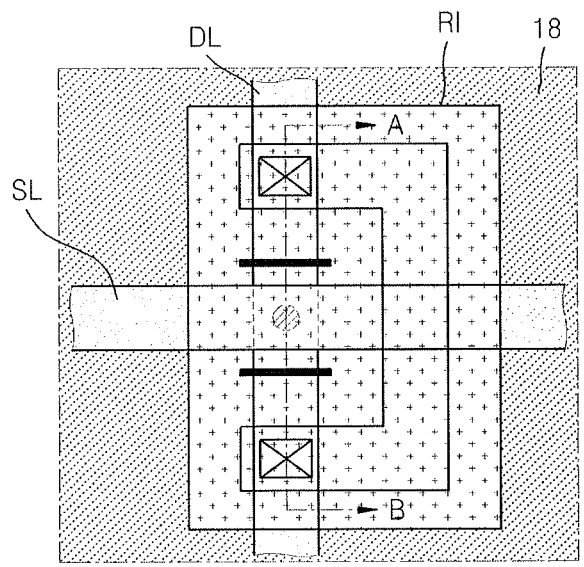
Figure 10B:
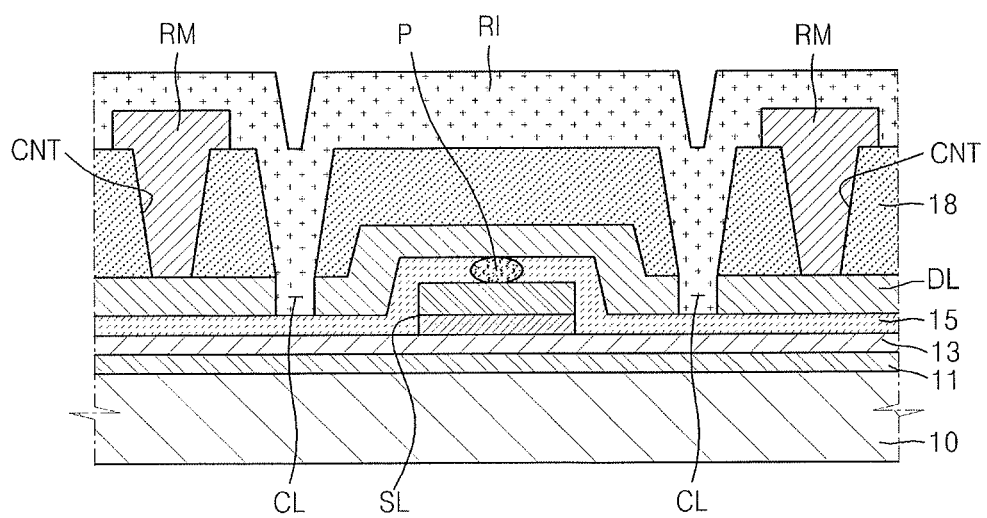

Referring to FIGS. 10A and 10B, a repair insulating layer RI is formed on the third insulating layer 18 on which the repair metal layer RM is formed so as to sufficiently cover the repair metal layer RM. In particular, the repair insulating layer RI is formed so as to cover all edges of the repair metal layer RM. For example, the repair insulating layer RI may overlap an entirety of an upper surface of the repair metal layer RM and may overlap an entirety of lateral sides of the repair metal layer RM. The repair insulating layer RI does not need to be formed on the entire backside and may be partially formed only in a region that needs to be repaired, i.e., regions including defective pixels.

The repair metal layer RM may become separated from the third insulating layer 18 since an adhesive strength between the repair metal layer RM and the third insulating layer 18 may not be high. However, according to exemplary embodiments, since the repair metal layer RM is covered with the repair insulating layer RI, the possibility of the repair metal layer RM being separated from the third insulating layer 18 may be reduced and/or prevented. To this end, the repair insulating layer RI may be formed of an insulating material having a high adhesive strength with the third insulating layer 18. When the third insulating layer 18 is formed of an organic insulating material, the repair insulating layer RI may also be formed of the organic insulating material.

The repair insulating layer RI may cover not only the repair metal layer RM but also fill, e.g., completely fill, the cut lines CL. By insulating the data line DL exposed via the cut lines CL, a short circuit defect may be prevented from occurring between the opposite electrode 20 and the cut lines CL during a subsequent process of forming the opposite electrode 20 (see FIG. 4).

Also, in the repairing method according to the current embodiment, the repair metal layer RM is formed after the third insulating layer 18 is formed, i.e., after the process of forming the backside including the first-layer pixel electrode 114 and the second-layer pixel electrode 115 of the organic light emitting display apparatus 1 is completed, thereby reducing the possibility of and/or preventing the repair metal layer RM from being separated from the third insulating layer

Figure 11A:
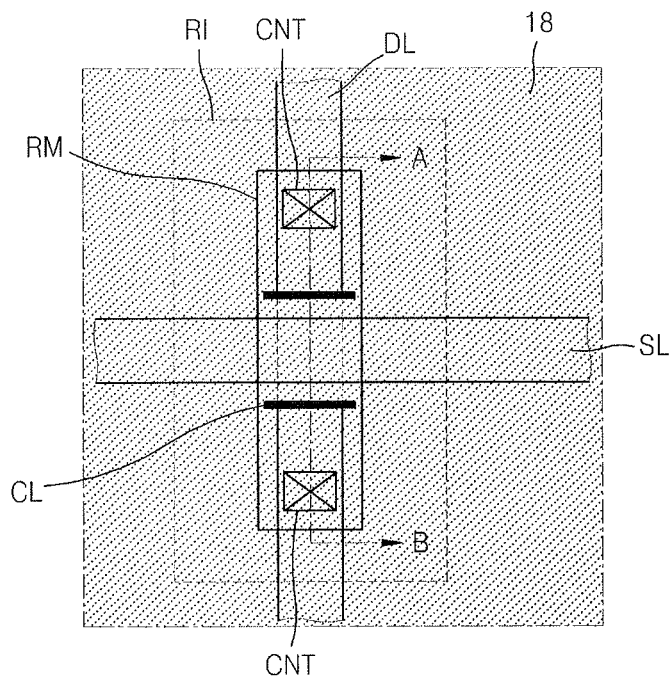
FIG. 11A is a plan view illustrating another case where a short circuit defect occurs at an intersection of a scan line and a data line of an organic light emitting display apparatus.
Figure 11B:
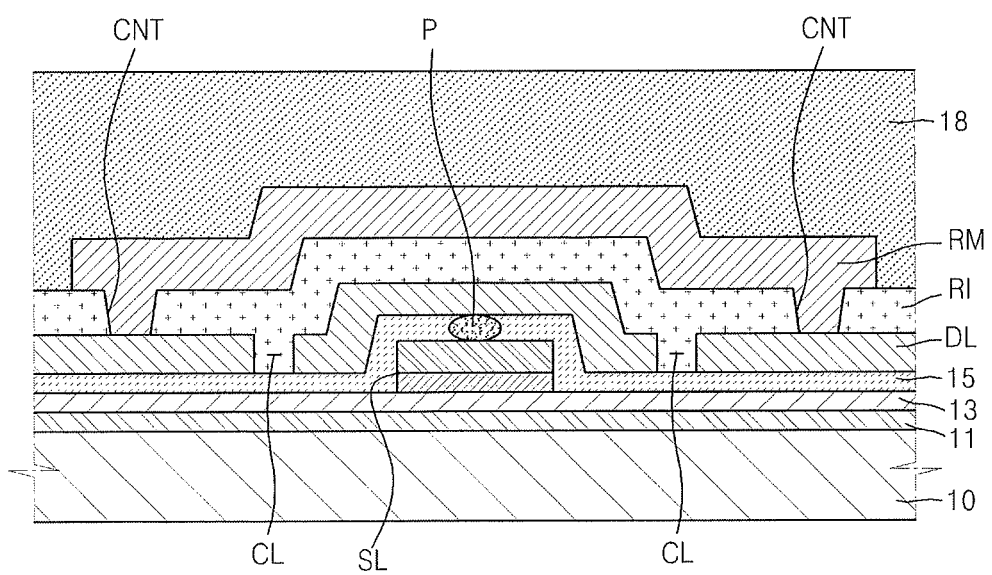
FIG. 11B is a cross-sectional view, taken along a line A-B of FIG. 11A.

18, as will be described in detail with reference to FIGS. 11A and 11B illustrating a comparative example.

FIG. 11A is a plan view illustrating another case where a short circuit defect occurs at an intersection of a scan line and a data line of an organic light emitting display apparatus. FIG. 11B is a cross-sectional view, taken along a line A-B of FIG. 11A.

Referring to FIGS. 11A and 11B, cut lines CL are formed, and a repair insulating layer RI is then first formed to cover a short-circuit defect region ST. After the repair insulating layer RI is formed, the repair insulating layer RI is patterned to form two contact holes CNT therein that expose an upper surface of a data line DL. Then, a repair metal layer RM is formed on the repair insulating layer RI having the contact holes CNT and is then connected to the data line DL. After the repair metal layer RM is formed, a process of forming the third insulating layer 18, which is a last process of a process of manufacturing a backside of the organic light emitting display apparatus, is performed. Since the third insulating layer 18 is formed after the repair metal layer RM is formed, the repair metal layer RM is exposed during the patterning of the third insulating layer 18, i.e., a photolithographical process of exposing the first-layer pixel electrode 114 and the second-layer pixel electrode 115 described above. In this case, the repair metal layer RM may be separated from the repair insulating layer RI.

In contrast, according to embodiments, after the patterning of the third insulating layer 18 by photolithography is completed, the repair metal layer RM is formed. Accordingly, the possibility of the repair metal layer RM being separated from the repair insulating layer RI may be reduced and/or prevented.

According to the above one or more embodiments, the repair metal layer RM may be sufficiently covered with the repair insulating layer RI, thereby preventing the repair metal layer RM from being separated from the third insulating layer 18. Also, the repair metal layer RM and the repair insulating layer RI are formed after the backside of the organic light emitting display apparatus is completed, i.e., after photolithography is completed, thereby preventing the repair metal layer RM from being separated from the third insulating layer 18.

The above embodiments have been described above with respect to a short circuit defect occurring in the scan lines SL and the data lines DL, but embodiments are not limited thereto and may also be applied to repair a short circuit defect occurring between wires that intersect one another. Also, embodiments are not limited to organic light emitting display apparatuses having structures as described above, and may also be applied to organic light emitting display apparatuses in which a repair metal layer and a repair insulating layer are formed after a backside is completed so as to repair a short circuit defect occurring in wires.

By way of summation and review, various wires connected to the TFT are each formed to have a fine critical dimension (CD). Thus, when a short circuit defect occurs between wires disposed on different layers and disposed to overlap with one another, the short circuit defect should be repaired.

Embodiments relate to a method of repairing the short circuit defect occurring between the wires, and a display apparatus, e.g., an organic light emitting display apparatus, manufactured according to the repairing method. According to the repairing method, a repair metal layer is formed so as to be sufficiently covered with a repair insulating layer, thereby reducing the possibility of and/or preventing the repair metal layer from being separated from an underlying insulating layer. Further, the repair metal layer and the repair insulating layer may be formed after a backside of an organic light emitting display apparatus is completed, e.g., after a final photolithography process is completed.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of repairing a defective pixel in a display apparatus, the display apparatus including a plurality of pixels that are each defined by one of a plurality of first signal wires and one of a plurality of second signal wires, the second signal wires intersecting the first signal wires, the defective pixel having a short circuit defect and being connected to a corresponding first signal wire and a corresponding second signal wire, the method comprising:
    forming an insulating layer to cover the plurality of second signal wires;
    cutting both sides of a region of the corresponding second signal wire of the defective pixel and the insulating layer to form both sides of a cut region;
    forming contact holes adjacent to the both sides of the cut region, respectively, such that an upper portion of the corresponding second signal wire is exposed;
    forming a repair metal layer on the insulating layer to contact the contact holes and the second signal wire; and
    forming a repair insulating layer to cover the repair metal layer.

2. The method of claim 1, wherein forming the insulating layer is a last photolithographical process performed during a process of manufacturing the display apparatus.

3. The method of claim 2, wherein forming the insulating layer includes forming a pixel defining layer of the display apparatus.

4. The method of claim 1, wherein the both sides of the region of the corresponding second signal wire of the defective pixel and the insulating layer are cut with a laser.

5. The method of claim 1, wherein the repair insulating layer and the insulating layer covering the second signal wires are each formed of an organic insulating layer.

6. The method of claim 1, wherein the repair insulating layer is formed on a part of the display apparatus.

7. The method of claim 1, wherein the repair metal layer is formed of a same material that forms the second signal wires.

8. The method of claim 1, wherein the repair metal layer is formed in a non-overlapping relationship with a line on which the cut region of the corresponding second signal wire is formed.

9. A display apparatus including a repaired pixel having a repaired short circuit defect, the display apparatus including a plurality of pixels that are each defined by one of a plurality of first signal wires and one of a plurality of second signal wires, the second signal wires intersecting the first signal wires, the repaired pixel being connected to a corresponding first signal wire and a corresponding second signal wire, the repaired pixel comprising:
    an insulating layer having cut lines at both sides of a region of the corresponding second signal wire including the repaired short circuit defect,
    contact holes arranged apart from the cut lines to expose an upper portion of the corresponding second signal wire;

a repair metal layer on the insulating layer and connected to the corresponding second signal wire via the contact holes; and a repair insulating layer covering the cut lines and the repair metal layer.

10. The display apparatus of claim 9, wherein each of the plurality of first signal wires and the plurality of second signal wires is one of scan lines and one of data lines, respectively.

11. The display apparatus of claim 9, wherein the cut lines extend in the insulating layer and are arranged along the both sides of the region of the corresponding second signal wire including the repaired short circuit defect.

12. The display apparatus of claim 9, wherein the repair metal layer is a by-pass of a line on which the corresponding second signal wire is formed.

13. The display apparatus of claim 9, wherein the repair insulating layer is only on the repaired pixel.

14. The display apparatus of claim 9, wherein the insulating layer and the repair insulating layer are organic insulating layers.

15. An organic light emitting display apparatus including a repaired pixel having a repaired short circuit defect, the display apparatus including a plurality of pixels that are each defined by one of a plurality of first signal wires and one of a plurality of second signal wires, the second signal wires intersecting the first signal wires, the repaired pixel being connected to a corresponding first signal wire and a corresponding second signal wire, each of the pixels including a first electrode, a second electrode, and an organic emission layer between the first and second electrodes, the repaired pixel comprising:

an insulating layer having cut lines at both sides of a region of the corresponding second signal wire including the repaired short circuit defect, contact holes arranged apart from the cut lines to expose an upper portion of the corresponding second signal wire;

a repair metal layer on the insulating layer to by-pass a line on which the corresponding second signal wire is formed, the repair metal layer being connected to the corresponding second signal wire via the contact holes; and a repair insulating layer covering the cut lines and the repair metal layer.

16. The organic light emitting display apparatus of claim 15, wherein each of the plurality of first signal wires and the plurality of second signal wires is one of scan lines and one of data lines, respectively.

17. The organic light emitting display apparatus of claim 16, wherein:

each of the pixels includes at least one thin film transistor (TFT), and the scan lines and the data lines are on a layer on which a gate electrode and source and drain electrodes of the at least one TFT are arranged.

18. The organic light emitting display apparatus of claim 17, wherein the gate electrode and the first electrode are formed on a same layer.

19. The organic light emitting display apparatus of claim 15, wherein the insulating layer is a pixel defining layer that defines a light emitting device on the first electrode.

20. The organic light emitting display apparatus of claim 15, wherein the repair insulating layer is arranged only on the repaired pixel.

* * * * *